United States Patent
Mueller

(10) Patent No.: US 7,297,633 B1
(45) Date of Patent: Nov. 20, 2007

(54) COMPOSITIONS FOR CHEMICAL MECHANICAL POLISHING SILICA AND SILICON NITRIDE HAVING IMPROVED ENDPOINT DETECTION

(75) Inventor: Brian L. Mueller, Middletown, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 11/446,936

(22) Filed: Jun. 5, 2006

(51) Int. Cl.
*H01L 21/302* (2006.01)

(52) U.S. Cl. .............. 438/692; 438/693; 438/700; 252/79.4; 216/89

(58) Field of Classification Search ........... 438/692, 438/693, 700; 252/79.4; 216/89
See application file for complete search history.

(56) References Cited

U.S. PATENT DOCUMENTS

| 6,021,679 | A | 2/2000 | Li et al. | |
| 6,228,280 | B1* | 5/2001 | Li et al. | 216/84 |
| 6,506,341 | B2 | 1/2003 | Li et al. | |
| 6,899,784 | B1 | 5/2005 | Li et al. | |
| 2005/0108947 | A1* | 5/2005 | Mueller et al. | 51/307 |

* cited by examiner

*Primary Examiner*—Binh X. Tran
(74) *Attorney, Agent, or Firm*—Edwin Oh; Thomas S. Diebert

(57) ABSTRACT

The present invention provides a method of manufacturing a composition for polishing silica and silicon nitride on a semiconductor substrate. The method comprises ion-exchanging carboxylic acid polymer to reduce ammonia and combining by weight percent 0.01 to 5 of the ion-exchanged carboxylic acid polymer with 0.001 to 1 quaternary ammonium compound, 0.001 to 1 phthalic acid and salts thereof, 0.01 to 5 abrasive, and balance water.

14 Claims, 3 Drawing Sheets

COMPOSITIONS FOR CHEMICAL MECHANICAL POLISHING SILICA AND SILICON NITRIDE HAVING IMPROVED ENDPOINT DETECTION

BACKGROUND OF THE INVENTION

In the semiconductor industry, critical steps in the production of integrated circuits are the selective formation and removal of films on an underlying substrate. The films are made from a variety of substances, and can be conductive or non-conductive. Conductive films are typically used for wiring or wiring connections. Non-conductive or dielectric films are used in several areas, for example, as interlevel dielectrics between layers of metallization, or as isolations between adjacent circuit elements.

Typical processing steps involve: (1) depositing a film, (2) patterning areas of the film using lithography and etching, (3) depositing a film that fills the etched areas, and (4) planarizing the structure by etching or chemical-mechanical polishing (CMP). Films are formed on a substrate by a variety of well-known methods, for example, physical vapor deposition (PVD) by sputtering or evaporation, chemical vapor deposition (CVD), plasma enhanced chemical vapor deposition (PECVD). Films are removed by any of several well-known methods, including, chemical-mechanical polishing, dry etching such as reactive ion etching (RIE), wet etching, electrochemical etching, vapor etching, and spray etching.

It is extremely important with removal of films to stop the process when the correct thickness has been removed. In other words, during the removal of films, it is important to know when the endpoint has been reached. In CMP, a film is selectively removed from a semiconductor wafer by rotating the wafer against a polishing pad (or rotating the pad against the wafer, or both) with a controlled amount of pressure in the presence of a chemically reactive slurry. Overpolishing of a film results in yield loss, and underpolishing requires costly rework. Accordingly, various methods have been employed to detect when the desired endpoint for removal has been reached, and the polishing should be stopped.

The prior art methods for CMP endpoint detection suitable for all types of films involve the following types of measurement: (1) simple timing, (2) friction or motor current, (3) capacitive, (4) optical, (5) acoustical, (6) conductive and (7) chemical. In particular, chemical endpoint detection (e.g., Li et al., U.S. Pat. No. 6,021,679) has been popular due to its ability to provide real-time and continuous analysis of the slurry during polishing, a direct signal endpoint as soon as the nitride layer is polished and a fast response time, typically less than one second, in addition to other benefits.

It has been discovered that when chemically-mechanically polishing a substrate with a target film of oxide ($SiO_2$) over a stopping film of nitride ($Si_3N_4$) with a slurry containing potassium hydroxide (KOH), a chemical reaction occurs when the oxide/nitride interface is reached, resulting in the production of ammonia ($NH_3$). When polishing oxide, the following reaction occurs:

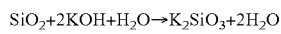

When polishing nitride, the following reaction occurs:

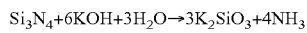

The ammonia produced is dissolved in the slurry and it exists primarily in the form of $NH_3$ rather than $NH_4^+$. Thus, the presence of ammonia in the slurry indicates that the underlying nitride film has been reached and polished, and the endpoint for removal of the oxide film can be determined by monitoring the level of ammonia in the slurry. Once the endpoint is reached, the polishing is stopped.

Typically, in order to detect and monitor ammonia in a gaseous form, slurry from a polishing apparatus is pumped through an ammonia extraction unit. The ammonia-containing gas stream can be analyzed and monitored for endpoint detection for removal of the target film. Gas phase chemical analysis, such as standard mass spectroscopy can be highly sensitive and have a fast response time, that would be desirable for endpoint detection. Unfortunately, with slurry sampling, there may be substantial interference from any residual ammonia created from the slurry composition itself, making accurate endpoint detection extremely difficult.

Hence, what is needed is a composition and method for chemical-mechanical polishing of silica and silicon nitride for shallow trench isolation processes having improved end-point detection capability.

STATEMENT OF THE INVENTION

In a first aspect, the present invention provides a method of manufacturing a composition for polishing silica and silicon nitride on a semiconductor substrate comprising: ion-exchanging carboxylic acid polymer to reduce ammonia; and combining by weight percent 0.01 to 5 of the ion-exchanged carboxylic acid polymer with 0.001 to 1 quaternary ammonium compound, 0.001 to 1 phthalic acid and salts thereof, 0.01 to 5 abrasive, and balance water.

In a second aspect, the present invention provides a method of chemical mechanical polishing silica and silicon nitride on a semiconductor substrate comprising: providing a polishing pad and a ceria-abrasive containing slurry; ion-exchanging a solution of carboxylic acid polymer to be utilized in the slurry to reduce ammonia in the solution to between 10 ppb to 2 ppm; and polishing the substrate utilizing the polishing pad and the slurry containing the ammonia-reduced solution of carboxylic acid polymer.

DETAILED DESCRIPTION OF THE INVENTION

Figure 1A:
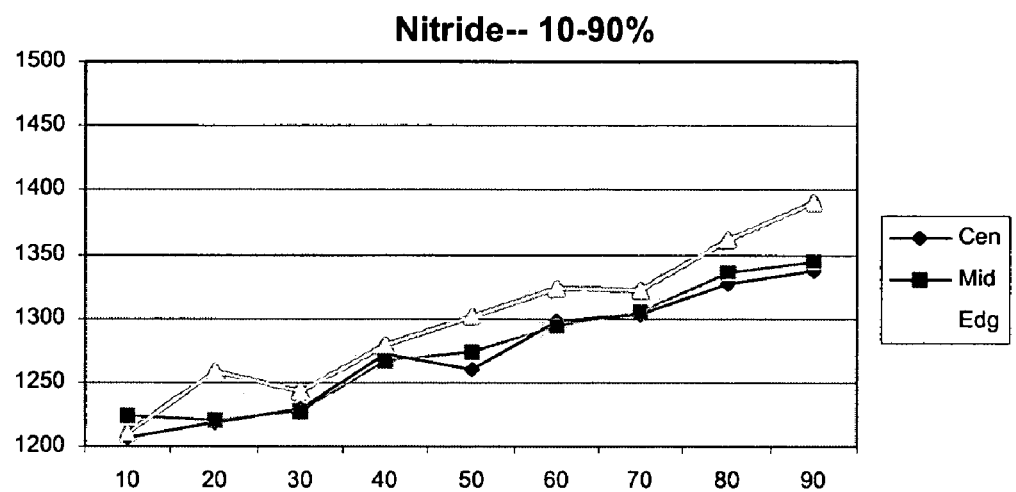
FIG. 1A illustrates the averages of post polishing results from center, middle and edge dies for retaining degree of wafer scale uniformity.

The composition and method provide improved end-point detection signals for use in chemical end-point detection systems. In particular, the composition and method of the present invention is ammonia-reduced, thereby improving the accuracy of the chemical end-point detection system. The invention advantageously utilizes an ion-exchange resin to reduce the ammonia content of the composition to reduce the interference from any slurry-originated ammonia contamination. In particular, the carboxylic acid polymer is ion-exchanged to reduce the ammonia content in the ceria-based slurry. In addition, the composition provides unexpected selectivity for removing silica relative to silicon nitride. The composition advantageously relies upon a chelating agent or a selectivity enhancer to selectively polish silica relative to silicon nitride for shallow trench isolation processes. In particular, the composition comprises a quaternary ammonium compound to selectively polish silica relative to silicon nitride, at the pH of the application.

The quaternary ammonium compounds of the present invention include the following structure:

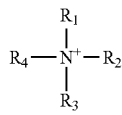

where $R_1$, $R_2$, $R_3$ and $R_4$ are an organic compound that has a carbon chain length of 1 to 15 carbon atoms. More preferably, $R_1$, $R_2$, $R_3$ and $R_4$ have a carbon chain length of 1 to 10. Most preferably, $R_1$, $R_2$, $R_3$ and $R_4$ have a carbon chain length of 1 to 5 carbon atoms. The organic compound of $R_1$, $R_2$, $R_3$ and $R_4$ may be a substituted or unsubstituted aryl, alkyl, aralkyl, or alkaryl group. Example anions include, nitrate, sulfate, halides (such as, bromide, chloride, fluoride and iodide), citrate, phosphate, oxalate, malate, gluconate, hydroxide, acetate, borate, lactate, thiocyanate, cyanate, sulfonate, silicate, per-halides (such as, perbromate, perchlorate and periodate), chromate, and mixtures comprising at least one of the foregoing anions.

Preferred quaternary ammonium compounds include, tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof. Most preferred quaternary ammonium compounds is tetramethyl ammonium hydroxide.

The composition advantageously contains 0.001 to 1 weight percent quaternary ammonium compound to selectively remove the silica relative to the silicon nitride. Advantageously, the composition contains 0.01 to 0.5 weight percent quaternary ammonium compound.

In addition to the quaternary ammonium compound, the composition advantageously contains 0.001 to 1 weight percent complexing agent. Advantageously, the composition contains 0.01 to 0.5 weight percent complexing agent. Example complexing agents include carbonyl compounds (e.g., acetylacetonates and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, phthalates, citrates, succinates, tartrates, malates, edetates (e.g., disodium EDTA), mixtures thereof, and the like), carboxylates containing one or more sulfonic and/or phosphonic groups. Also, other suitable complexing agents include, for example, di-, tri-, or poly-alcohols (e.g., ethylene glycol, pyrocatechol, pyrogallol, tannic acid, and the like) and phosphate-containing compounds (e.g., phosphonium salts and phosphonic acids). Preferably, the complexing agent is phthalic acid and salts thereof. Preferred phthalate salts include, ammonium hydrogen phthalate and potassium hydrogen phthalate, and mixtures thereof.

Advantageously, the novel polishing composition contains about 0.01 to 5 weight percent of a carboxylic acid polymer. Preferably, the composition contains about 0.05 to 3 weight percent of a carboxylic acid polymer. Also, the polymer preferably has a number average molecular weight of about 20,000 to 1,500,000. In addition, blends of higher and lower number average molecular weight carboxylic acid polymers can be used. These carboxylic acid polymers generally are in solution but may be in an aqueous dispersion. The number average molecular weight of the aforementioned polymers are determined by GPC (gel permeation chromatography).

The carboxylic acid polymers are formed from unsaturated monocarboxylic acids and unsaturated dicarboxylic acids. Typical unsaturated monocarboxylic acid monomers contain 3 to 6 carbon atoms and include acrylic acid, oligomeric acrylic acid, methacrylic acid, crotonic acid and vinyl acetic acid. Typical unsaturated dicarboxylic acids contain 4 to 8 carbon atoms and include the anhydrides thereof and are, for example, maleic acid, maleic anhydride, fumaric acid, glutaric acid, itaconic acid, itaconic anhydride, and cyclohexene dicarboxylic acid. In addition, water soluble salts of the aforementioned acids also can be used.

In addition, carboxylic acid containing copolymers and terpolymers can be used in which the carboxylic acid component comprises 5-75% by weight of the polymer. Typical of such polymer are polymers of (meth)acrylic acid and acrylamide or methacrylamide; polymers of (meth)acrylic acid and styrene and other vinyl aromatic monomers; polymers of alkyl (meth)acrylates (esters of acrylic or methacrylic acid) and a mono or dicarboxylic acid, such as, acrylic or methacrylic acid or itaconic acid; polymers of substituted vinyl aromatic monomers having substituents, such as, halogen, i.e., chlorine, fluorine, bromine, nitro, cyano, alkoxy, haloalkyl, carboxy, amino, amino alkyl and a unsaturated mono or dicarboxylic acid and an alkyl (meth)acrylate; polymers of monethylenically unsaturated monomers containing a nitrogen ring, such as, vinyl pyridine, alkyl vinyl pyridine, vinyl butyrolactam, vinyl caprolactam, and an unsaturated mono or dicarboxylic acid; polymers of olefins, such as, propylene, isobutylene, or long chain alkyl olefins having 10 to 20 carbon atoms and an unsaturated mono or dicarboxylic acid; polymers of vinyl alcohol esters, such as, vinyl acetate and vinyl stearate or vinyl halides, such as, vinyl fluoride, vinyl chloride, vinylidene fluoride or vinyl nitriles, such as, acrylonitrile and methacrylonitrile and an unsaturated mono or dicarboxylic acid; polymers of alkyl (meth)acrylates having 1-24 carbon atoms in the alkyl group and an unsaturated monocarboxylic acid, such as, acrylic acid or methacrylic acid. These are only a few examples of the variety of polymers that can be used in the novel polishing composition of this invention. Also, it is possible to use polymers that are biodegradeable, photodegradeable or degradeable by other means. An example of such a composition that is biodegradeable is a polyacrylic acid polymer containing segments of poly(acrylate comethyl 2-cyanoacrylate).

Advantageously, the carboxylic acid polymer of the present invention is ion-exchanged to reduce the ammonia content that may interfere with an ammonia-detecting, end-point detection system. In particular, the ion-exchange resin of the present invention has anionic groups incorporated therein. These anionic groups render the cationic ion exchange resin capable of adsorbing soluble cations, such as, metal ions (e.g., $Na^+$, $K^+$, $Ca^{+2}$, $Fe^{+3}$ ... etc.) and ammonia from an aqueous solution. Resins of the present invention are capable of reducing the cation concentrations to between 10 ppb to 2 ppm. More preferably, resins of the present invention are capable of reducing the cation concentrations to between 50 ppb to 1 ppm. Most preferably, resins of the present invention are capable of reducing the cation concentrations to less than 100 ppb to 200 ppb. These ion exchange resins are typically regenerated using strong acids to desorb the adsorbed ions and replace them with hydronium ions. Preferred ion exchange resins include, Amberlite® ion exchange resins from the Rohm and Haas Company, of Philadelphia, Pa. A preferred ion exchange resin is Amberlite® IRN-77.

The cation exchange resins of the present invention may have the physical form of gel beads, e.g. spherical gel beads, or macroporous beads, including macroreticular beads or comminuted resin particles that are gel or macroporous resin. Such comminuted particles may be derived from bulk-polymerized or suspension-polymerized polymers using known comminution techniques.

Preferred ion exchange resin particles are those prepared by functionalizing crosslinked, suspension-polymerized copolymer beads that are well known in the art as precursors for ion exchange resins. Gel copolymer beads bear their functional groups in an outer shell of uniform depth. Because the functionalization processes used to prepare these beads penetrate the copolymer at a uniform rate, the thickness of the functionalized layers tend to be uniform for all beads regardless of bead size, provided only that the smallest beads are not completely functionalized, i.e., not completely sulfonated. As a result, the diffusion paths are highly uniform, regardless of the uniformity of bead size.

Monomers suitable for preparing crosslinked copolymer include monovinyl aromatic monomers, for example, styrene, vinyltoluene, vinyl naphthalene, ethyl vinyl benzene, vinyl chlorobenzene, chloromethylstyrene and the like, which may comprise from about 50 to about 99.5 mole percent, preferably 80 to about 99 mole percent, of the monomers from that the copolymer is made, and polyvinyl monomers having at least two active vinyl groups polymerizable with the monovinyl monomer, which may comprise from about 0.5 to about 50 mole percent, preferably from 1 to about 20 mole percent, of the monomers from that the copolymer is made. Examples of suitable polyvinyl monomers include divinylbenzene, trimethylolpropane trimethacrylate, ethylene glycol dimethacrylate, divinyltoluene, trivinylbenzene, divinylchlorobenzene, diallyl phthalate, divinylpyridine, divinylnaphthalene, ethylene glycol diacrylate, neopentyl glycol dimethacrylate, diethylene glycol divinyl ether, bis-phenol-A-dimethacrylate, pentaerythritol tetra- and trimethacrylates, divinyl xylene, divinylethylbenzene, divinyl sulfone, divinyl ketone, divinyl sulfide, allyl acrylate, diallyl maleate, diallyl fumarate, diallyl succinate, diallyl carbonate, diallyl malonate, diallyl oxylate, diallyl adipate, diallyl sebacate, diallyl tartrate, diallyl silicate, diallyl tricarballylate, triallyl aconitate, triallyl citrate, triallyl phosphate,N,N'-methylene-diacrylamide, N,N'-methylene-dimethacrylamide, N,N'-ethylenediacrylamide, trivinyl naphthalene, polyvinylanthracenes and the polyallyl and polyvinyl ethers of glycol, glycerol, pentaerythritol, resorcinol, and the monothio and dithio derivatives of glycols. The monomer mixture may also contain up to about 5 mole percent of other vinyl monomers that do not affect the basic nature of the resulting resin matrix, for example, acrylonitrile, butadiene, methacrylic acid and others known in the art. In one embodiment of the invention, the copolymer particles are acrylic ester copolymer particles.

One desirable form of functionalization is sulfonation, and the present invention is capable of providing partially sulfonated resins that are significantly better able to withstand the stress of the loading and regeneration cycle in aqueous ion exchange applications than resins formed by sulfonating conventional copolymers, either in the solvent-swollen or non-swollen state.

Advantageously, the polishing composition contains 0.01 to 5 weight percent abrasive to facilitate silica removal. Within this range, it is desirable to have the abrasive present in an amount of greater than or equal to 0.1 weight percent. Also, desirable within this range is an amount of less than or equal to 3 weight percent.

The abrasive has an average particle size between 50 to 200 nanometers (nm). For purposes of this specification, particle size refers to the average particle size of the abrasive. More preferably, it is desirable to use an abrasive having an average particle size between 80 to 150 nm. Decreasing the size of the abrasive to less than or equal to 80 nm, tends to improve the planarization of the polishing composition, but, it also tends to decrease the removal rate.

Example abrasives include inorganic oxides, inorganic hydroxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), or combinations comprising at least one of the foregoing oxides. Modified forms of these inorganic oxides, such as, polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles and coated polymeric particles. The preferred abrasive is ceria.

The compounds provide efficacy over a broad pH range in solutions containing a balance of water. This solution's useful pH range extends from at least 4 to 7. In addition, the solution advantageously relies upon a balance of deionized water to limit incidental impurities. The pH of the polishing fluid of this invention is preferably from 4.5 to 6.8, more preferably a pH of 5 to 6.5. The acids used to adjust the pH of the composition of this invention are, for example, nitric acid, sulfuric acid, hydrochloric acid, phosphoric acid and the like. Exemplary bases used to adjust the pH of the composition of this invention are, for example, potassium hydroxide.

Accordingly, the present invention provides a composition and method having improved end-point detection signals for use in chemical end-point detection systems. In particular, the composition and method of the present invention is ammonia-reduced, thereby improving the accuracy of the chemical end-point detection system. The invention advantageously utilizes an ion-exchange resin to reduce the ammonia content of the composition to reduce the interference from any slurry-originated ammonia contamination. a composition useful for polishing silica and silicon nitride on a semiconductor wafer for shallow trench isolation processes. In particular, the carboxylic acid polymer is ion-exchanged to reduce the ammonia content in the ceria-based slurry. In addition, the composition advantageously comprises quaternary ammonium compounds for improved selectivity. In particular, the present invention provides an aqueous composition useful for polishing silica and silicon nitride on a semiconductor wafer comprising quaternary ammonium compound, phthalic acid and salts thereof, carboxylic acid polymer, abrasive and balance water. The composition exhibits particularly improved selectivity at a pH range of 4 to 7. Note, although the present embodiment concerns reduction of the ammonia content from the carboxylic acid polymer, the invention is not so limited. In other words, any constituent or component of the slurry, for example, the quaternary ammonium compound may be ion-exchanged to reduce any ammonia content, as necessary.

EXAMPLE 1

All example solutions contained, by weight percent, 1.8 ceria, 0.18 polyacrylic acid, and 0.21 potassium hydrogen phthalate. In addition, the examples of the invention contained 0.12 weight percent, of a quaternary ammonium compound, in particular, tetramethyl ammonium hydroxide. The slurry was prepared by combining an abrasive package with a chemical package. The abrasive package was made by dissolving the polyacrylic acid concentrate in deionized water using a blade mixer and adding the ceria concentrate into the polyacrylic acid solution. Advantageously, the polyacrylic acid polymer was ion-exchanged with Amberlite IRN-77 ion exchange resin. The ion exchange resin was purchased in cylinders from Siemens Water Technologies, of Warrendale, Pa. The solution of carboxylic acid polymer is diluted to 5 percent to reduce the viscosity of the solution. The solution is pumped through the cylinders packed with the cationic ion exchange resin. The resin passes through the resin bed and comes out at a pH less than 3 and essentially free of all cationic species such as metal ions or ammonia. Then, the ceria-polyacrylic acid-water mixture was titrated using nitric acid. The mixture was then fed into a high shear Kady Mill. The chemical package was prepared by dissolving all remaining chemicals into deionized water, in proper amounts, mixing with a blade mixer and titrating to the final pH as desired using nitric acid. The final slurry is prepared by mixing the abrasive package with the chemical package and titrating to the desired pH.

The patterned wafers were STI-MIT-864™ masks from Praesagus, Inc. with HDP and LPCVD-SiN films. The MIT-864 mask design had 20 mm by 20 mm die consisting of 4 mm by 4 mm features. The features in the mask had 100 µm pitches with densities ranging from 10% to 100% each, and 50% densities with pitches ranging from 1 to 1000 µm. Here, 50% density is defined as the spaces in an array of repeated structures wherein the space width/(space width+line width)×100%=50%. For example, if the space width+line width=1000 microns, the 50% space has a width of 500 microns. IC1010™ polishing pads were used for all tests. An Applied Materials Mirra® 200 mm polishing machine using an IC1010™ polyurethane polishing pad (Rohm and Haas Electronic Materials CMP Inc., of Newark, Del.) under downforce conditions of 2.7 psi and a polishing solution flow rate of 85 cc/min, a platen speed of 123 RPM and a carrier speed of 44 RPM planarized the samples. The polishing solutions had a pH of 6.1 adjusted with nitric acid. All solutions contained a balance of deionized water. Oxide and nitride film thicknesses were measured using an Optiprobe® 2600 metrology tool from Therma-Wave, Inc.

Figure 1B:
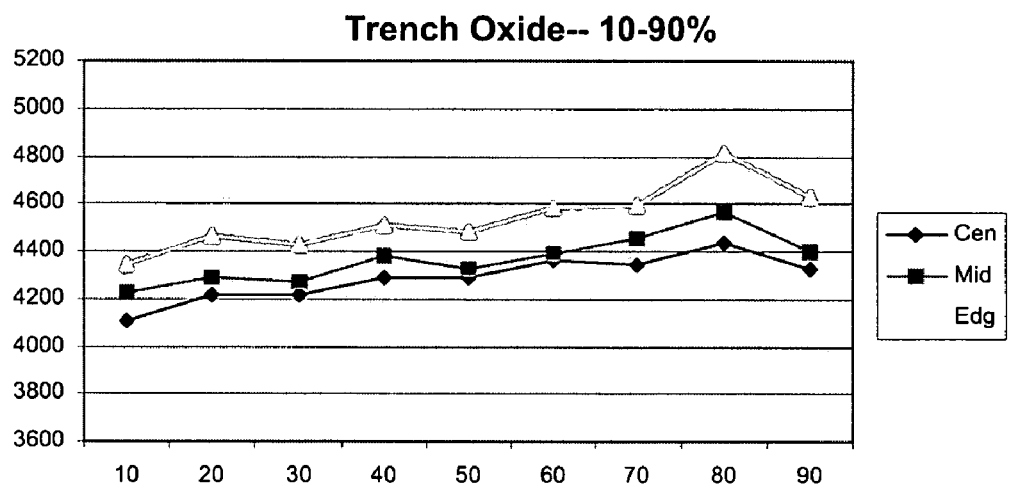
FIG. 1B illustrates the averages of post polishing results from center, middle and edge dies for retaining degree of wafer scale uniformity.

As illustrated in FIG. 1A, 1B, the averages of post polishing results from center, middle and edge dies for retaining degree of wafer scale uniformify information is shown. As shown in FIG. 1A, the average trench within-die range was 300-400 Å. As shown in FIG. 1B, the nitride thickness within-die range was 150 Å. Total trench oxide loss reflects the combination of dishing and erosion.

EXAMPLE 2

This experiment compared results of chemical end-point data with that of frictional and optical data for analyzing endpoint robustness. The chemical end-point detection system was an Eco Systems M17 N-EPD by Eco Physics. All other parameters were the same as those of Example 1.

Figure 2:
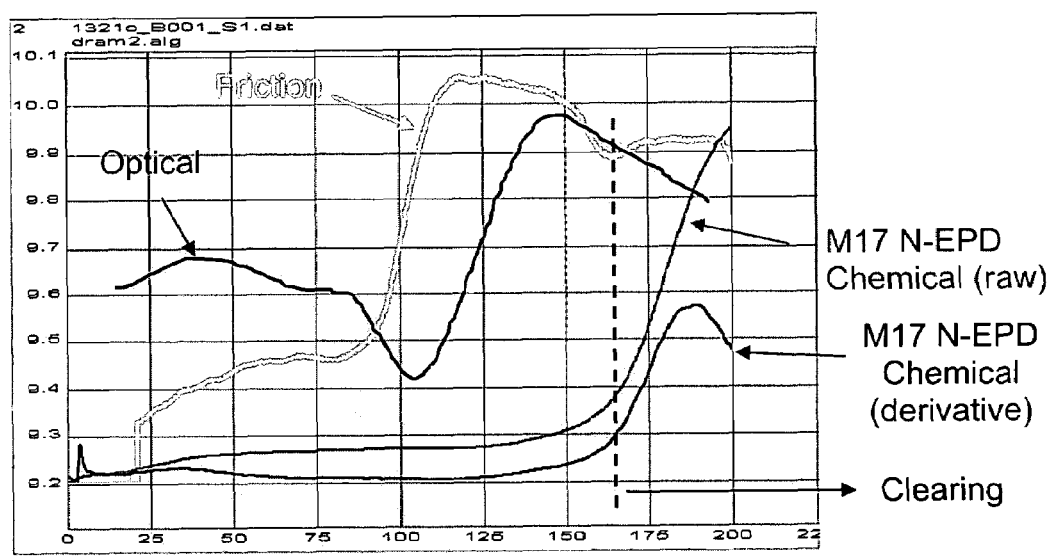
FIG. 2 illustrates results obtained utilizing various endpoint detection techniques.

As illustrated in FIG. 2, the chemical endpoint was the most straightforward to interpret ("on/off"), allowing high manufacturability. The chemical endpoint was determinable 10-15 seconds ahead of frictional or optical endpoints. The chemical endpoint allowed enhanced overpolish window confidence and process robustness.

EXAMPLE 3

This experiment compared results of chemical end-point data with that of frictional and optical data for analyzing planarization efficiency. The chemical end-point detection system was the same as in Example 2. All other parameters were the same as those of Example 1.

Figure 3A:
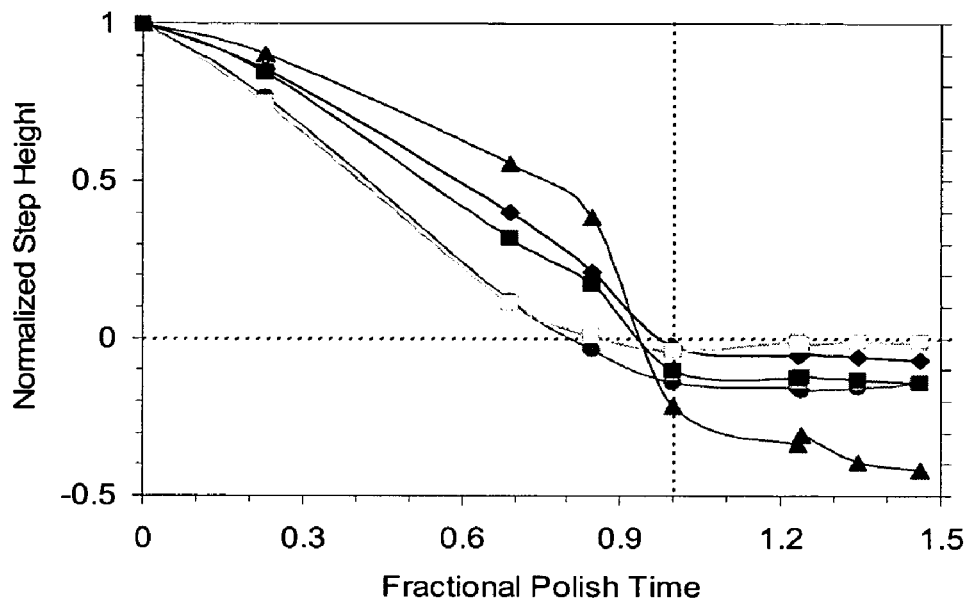
FIG. 3A illustrates planarization efficiencies obtained utilizing various end-point detection techniques.
Figure 3B:
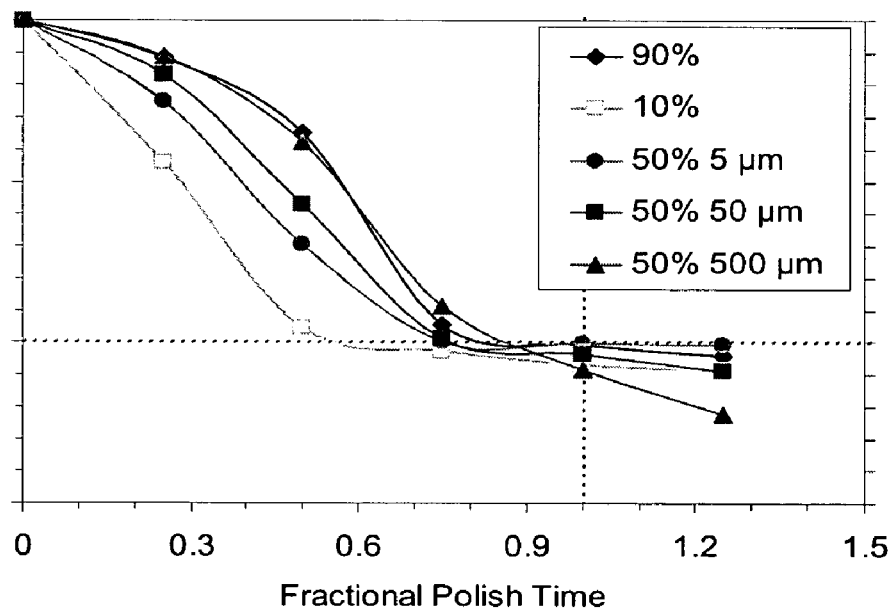
FIG. 3B illustrates planarization efficiencies obtained utilizing various end-point detection techniques.

As illustrated in FIG. 3A, 3B, the optimized process utilizing chemical end-point significantly improved planarization efficiency. The chemical end-point system improved oxide clearing confidence and shorter over-polish requirement.

Accordingly, the present invention provides a composition and method having improved end-point detection signals for use in chemical end-point detection systems. In particular, the composition and method of the present invention is ammonia-reduced, thereby improving the accuracy of the chemical end-point detection system. The invention advantageously utilizes an ion-exchange resin to reduce the ammonia content of the composition to reduce the interference from any slurry-originated ammonia contamination. a composition useful for polishing silica and silicon nitride on a semiconductor wafer for shallow trench isolation processes.

The invention claimed is:

1. A method of manufacturing a composition for polishing silica and silicon nitride on a semiconductor substrate comprising:
   providing a carboxylic acid polymer in aqueous solution;
   contacting the aqueous solution with an ion exchange resin to remove soluble cations and ammonia from the aqueous solution providing an ion-exchanged carboxylic acid polymer in aqueous solution;
   adding (i) an abrasive, (ii) a quaternary ammonium compound and (iii) phthalic acid or a phthalic acid salt to the ion-exchanged carboxylic acid polymer in aqueous solution to provide a slurry having 0.01 to 5 wt % of the ion-exchanged carboxylic acid polymer, 0.001 to 1 wt % of the quaternary ammonium compound, 0.001 to 1 wt % of the phthalic acid or phthalic acid salt and 0.01 to 5 wt % abrasive.

2. The method of claim 1 wherein the quaternary ammonium compound is selected from tetramethyl ammonium hydroxide, tetraethyl ammonium hydroxide, tetrapropyl ammonium hydroxide, tetraisopropyl ammonium hydroxide, tetracyclopropyl ammonium hydroxide, tetrabutyl ammonium hydroxide, tetraisobutyl ammonium hydroxide, tetratertbutyl ammonium hydroxide, tetrasecbutyl ammonium hydroxide, tetracyclobutyl ammonium hydroxide, tetrapentyl ammonium hydroxide, tetracyclopentyl ammonium hydroxide, tetrahexyl ammonium hydroxide, tetracyclohexyl ammonium hydroxide, and mixtures thereof.

3. The method of claim 1 wherein the phthalic acid or phthalic acid salt is potassium hydrogen phthalate.

4. The method of claim 1 wherein the slurry has a pH of 4 to 7.

5. The method of claim 1, wherein the ion-exchanged carboxylic acid polymer in aqueous solution has a cation concentration of 10 ppb to 2 ppm.

6. The method of claim 1, wherein the ion-exchanged carboxylic acid polymer in aqueous solution has a cation concentration of 50 ppb to 1 ppm.

7. The method of claim 1, wherein the ion-exchanged carboxylic acid polymer is aqueous solution has a cation concentration of 100 ppb to 200 ppb.

8. The method of claim 1 wherein the abrasive is ceria.

9. The method of claim 8 wherein the ceria has an average particle size of between 50-200 nm.

10. The method of claim 8 wherein the ceria has an average particle size of between 80-150 nm.

11. A method of chemical mechanical polishing silica and silicon nitride on a semiconductor substrate comprising:
providing a polishing pad;
providing a slurry, wherein the slurry is obtained by:
    providing a carboxylic acid polymer in aqueous solution;
    contacting the aqueous solution with an ion exchange resin to remove soluble cations and ammonia from the aqueous solution providing an ion-exchanged carboxylic acid polymer in aqueous solution;
    adding (i) an abrasive, (ii) a quaternary ammonium compound and (iii) phthalic acid or a phthalic acid salt to the ion-exchanged carboxylic acid polymer in aqueous solution to provide a slurry having 0.01 to 5 wt % of the ion-exchanged carboxylic acid polymer, 0.001 to 1 wt % of the quaternary ammonium compound, 0.001 to 1 wt % of the phthalic acid or phthalic acid salt and 0.01 to 5 wt % abrasive;
polishing the semiconductor substrate utilizing the polishing pad and the slurry.

12. The method of claim 11 wherein the ceria abrasive has an average particle size of between 50-200 nm.

13. The method of claim 11 wherein the slurry has a pH of 4 to 7.

14. The method of claim 11, further comprising:
chemically detecting a polishing endpoint and stopping polishing, wherein chemically detecting comprises monitoring the level of ammonia in the slurry.

* * * * *